(12) United States Patent
Park et al.

(10) Patent No.: US 9,691,460 B2
(45) Date of Patent: Jun. 27, 2017

(54) MEMORY DEVICE BASED ON DOMAIN WALL MEMORY AND READING AND WRITING METHOD THEREOF, AND APPARATUS FOR DIGITAL SIGNAL PROCESSING USING THE SAME

(71) Applicant: KOREA UNIVERSITY RESEARCH AND BUSINESS FOUNDATION, Seoul (KR)

(72) Inventors: Jongsun Park, Seoul (KR); Jin-Il Chung, Namyangju-si (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 15/056,668

(22) Filed: Feb. 29, 2016

(65) Prior Publication Data

US 2017/0103793 A1   Apr. 13, 2017

(30) Foreign Application Priority Data

Oct. 7, 2015 (KR) .................. 10-2015-0140849
Feb. 26, 2016 (KR) .................. 10-2016-0023327

(51) Int. Cl.
*G11C 11/16*    (2006.01)
*G06F 5/06*     (2006.01)

(52) U.S. Cl.
CPC ............ *G11C 11/165* (2013.01); *G06F 5/065* (2013.01); *G06F 2205/067* (2013.01)

(58) Field of Classification Search
USPC ....................................................... 365/158
See application file for complete search history.

(56) References Cited

U.S. PATENT DOCUMENTS

| 5,734,680 A * | 3/1998 | Moore ............ G11B 20/10009 375/262 |
| 2013/0235653 A1* | 9/2013 | Kondo ................... G11C 11/16 365/158 |
| 2013/0242647 A1* | 9/2013 | Nakamura ............ G11C 11/14 365/158 |

FOREIGN PATENT DOCUMENTS

KR   10-2014-0134515 A   11/2014

OTHER PUBLICATIONS

Chung et al.: "Domain Wall Memory based Digital Signal Processors for Area and Energy-Efficiency", 2015 ACM/EDAC/IEEE Design Automation Conference (DAC), Jun. 7-11, 2015, Monscone Center, San Francisco, CA. United States.
Motaman et al., "Domain Wall Memory-Layout, Circuit and Synergistic Systems," IEEE Transactions of Nanotechnology (Mar. 2015); 14(20):282-291.

* cited by examiner

*Primary Examiner* — Huan Hoang
*Assistant Examiner* — Minh Dinh
(74) *Attorney, Agent, or Firm* — Fox Rothschild LLP

(57) ABSTRACT

At least one magnetic nanowire including multiple cells; a write-read head combined with a first contact of the magnetic nanowire; and a read-only head combined with a second contact of the magnetic nanowire. Data stored through a write head included in the write-read head are read in sequence through a read head included in the write-read head in response to a last in first out (LIFO) method.

11 Claims, 15 Drawing Sheets

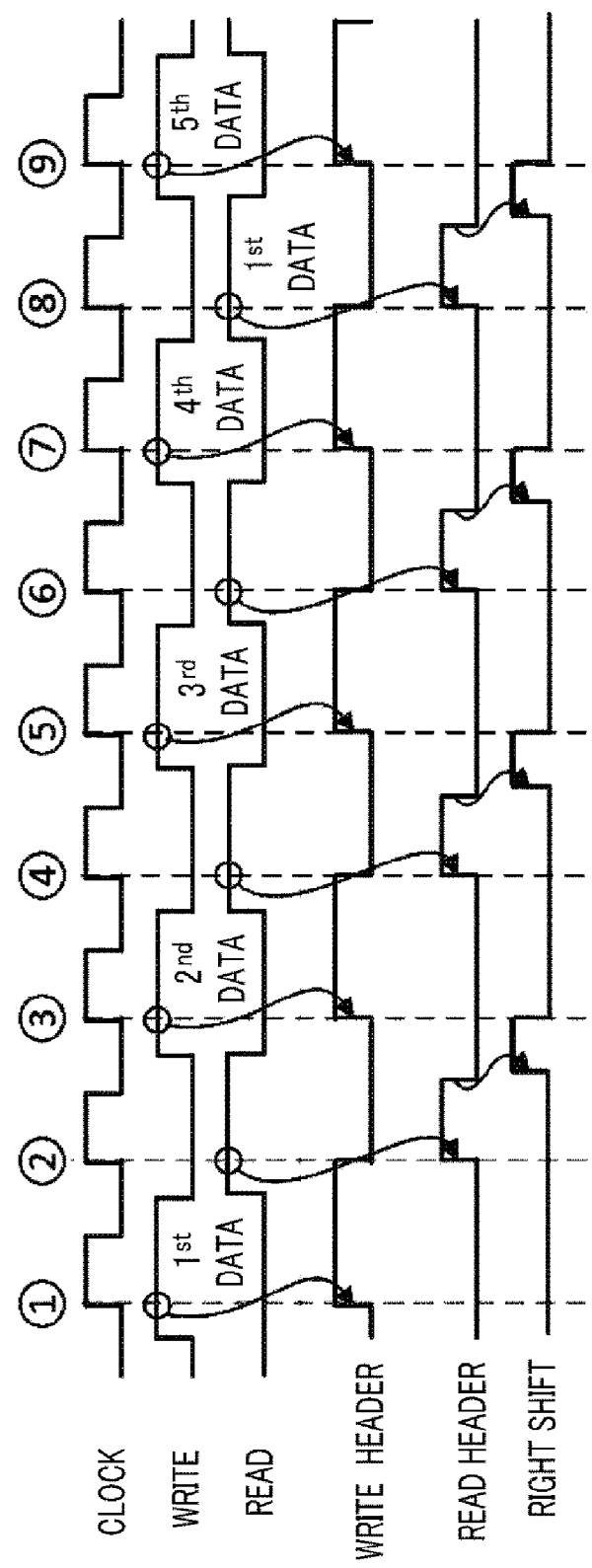

MEMORY DEVICE BASED ON DOMAIN WALL MEMORY AND READING AND WRITING METHOD THEREOF, AND APPARATUS FOR DIGITAL SIGNAL PROCESSING USING THE SAME

CROSS-REFERENCE TO RELATED APPLICATION

This application claims the benefit under 35 USC 119(a) of Korean Patent Application No. 10-2015-0140849 filed on Oct. 7, 2015 and No. 10-2016-0023327 filed on Feb. 26, 2016, in the Korean Intellectual Property Office, the entire disclosures of which are incorporated herein by reference for all purposes.

TECHNICAL FIELD

The present disclosure relates to a memory device based on domain wall memory and reading and writing method thereof, and apparatus for digital signal processing using the same

BACKGROUND

A conventional digital signal processor (DSP) may include a static random access memory (SRAM)-based embedded memory and a flip flop-based shift register. Therefore, in the conventional digital signal processor, the memory and the shift register may occupy a significant portion of area and consume a significant fraction of power. Accordingly, if the conventional digital signal processor is used in a smart phone or Internet-of-Thing (IoT) which is heavily constrained in power and area, this problem may be worsened.

Accordingly, in recent years, there have been actively studied digital signal processors using a non-volatile memory, such as a spin-transfer torque magnetic random-access memory (STT-RAM), domain wall memory, and a resistive random-access memory (ReRAM), instead of the static random access memory.

The non-volatile memory has the merits of high density, low power, and low cost. Therefore, if the non-volatile memory is used in a digital signal processor, it is efficient in reduction of area and cost for power. Further, the non-volatile memory has read and write speeds which are asymmetrical to each other.

The memory access of the digital signal processor is quite regular. Therefore, memory access patterns of the digital signal processor are predictable. Accordingly, a digital signal processor architecture for using sequential memory access and a non-volatile memory in which read and write operations are asymmetrical to each other is needed.

In this regard, Korean Patent Laid-open Publication No. 10-2014-0134515 (entitled "Digital signal processor and method for inputting and outputting data") discloses a digital signal processor including: a DRAM including multiple memory cells configured to store data in a parasitic capacitor; and a core logic configured to perform data write, read, or update operations to the DRAM based on a preset digital signal processing algorithm, and a method for inputting and outputting data.

SUMMARY

In view of the foregoing, the present disclosure provides a domain wall memory-based memory device and a method for writing and reading data using the memory device. Further, the present disclosure may provide an apparatus for digital signal processing using a domain wall memory-based memory apparatus and including a Viterbi decoder, a pipelined fast Fourier transform (FFT) processing unit, a pipelined sorting processing unit, and a distributed arithmetic operation-based finite impulse response filter processing unit.

However, problems to be solved by the present disclosure are not limited to the above-described problems. There may be other problems to be solved by the present disclosure.

As a technical means for solving the above-described problem, in accordance with a first exemplary embodiment, there is provided a memory device based on a domain wall memory. The memory device includes at least one magnetic nanowire including multiple cells; a write-read head combined with a first contact of the magnetic nanowire; and a read-only head combined with a second contact of the magnetic nanowire, wherein data stored through a write head included in the write-read head are read in sequence through a read head included in the write-read head in response to a last in first out (LIFO) method.

Further, in accordance with a second exemplary embodiment, there is provided a digital signal processor comprising a Viterbi decoder. The Viterbi decoder includes a survivor memory. The survivor memory is a domain wall memory and includes: at least one magnetic nanowire including multiple cells; a write-read head combined with a first contact of the magnetic nanowire; and a read-only head combined with a second contact of the magnetic nanowire, data stored through a write head included in the write-read head are read in sequence through a read head included in the write-read head in response to a last in first out (LIFO) method, and data for tracing back a survivor path are output through the read head included in the write-read head in response to a traceback read operation of the Viterbi decoder.

Further, in accordance with a third exemplary embodiment, there is provided a method for writing and reading a memory device including a domain wall memory. The method includes storing data by a magnetic nanowire included in the memory device through a write head included in a write-read head; and reading the data in sequence by the magnetic nanowire through a read head included in the write-read head in response to a last in first out (LIFO) method. Wherein the memory device includes at least one magnetic nanowire including multiple cells; the write-read head combined with a first contact of the magnetic nanowire; and a read-only head combined with a second contact of the magnetic nanowire.

Since the present disclosure uses a domain wall memory, the memory occupies a smaller area and consumes less power for writing and reading data than a conventional memory device using a static random access memory, and, thus, it is efficient in terms of energy and space. Further, since the present disclosure uses multiple magnetic nanowires in turn, the performance similar to that of the conventional static random access memory-based memory device can be assured. Accordingly, the present disclosure is suitable for smart phones and IoT devices.

The foregoing summary is illustrative only and is not intended to be in any way limiting. In addition to the illustrative aspects, embodiments, and features described above, further aspects, embodiments, and features will

BRIEF DESCRIPTION OF THE DRAWINGS

FIGS. 10A and 10B are a series of exemplary diagrams of data write and read processes of the FIFO register file which is useful for understanding an exemplary embodiment of the present disclosure;

MODE FOR CARRYING OUT THE INVENTION

Figure 1A:
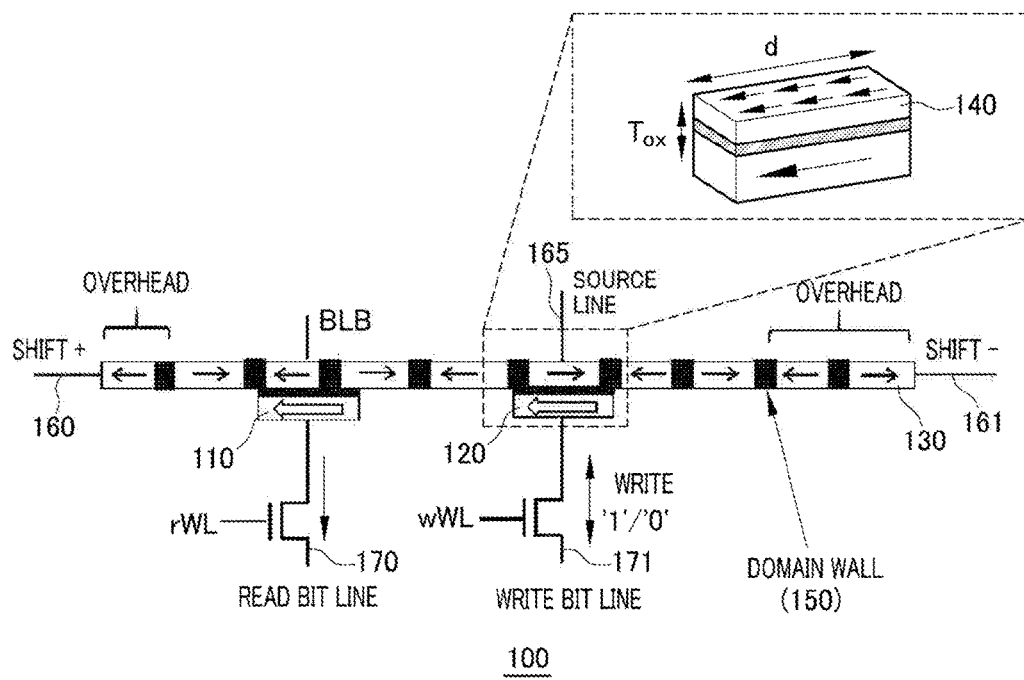
FIGS. 1A and 1B are a series of block diagrams of the domain wall memory.

Hereinafter, embodiments of the present disclosure will be described in detail with reference to the accompanying drawings so that the present disclosure may be readily implemented by those skilled in the art. However, it is to be noted that the present disclosure is not limited to the embodiments but can be embodied in various other ways. In drawings, parts irrelevant to the description are omitted for the simplicity of explanation, and like reference numerals denote like parts through the whole document.

Through the whole document, the term "connected to" or "coupled to" that is used to designate a connection or coupling of one element to another element includes both a case that an element is "directly connected or coupled to" another element and a case that an element is "electronically connected or coupled to" another element via still another element. Further, the term "comprises or includes" and/or "comprising or including" used in the document means that one or more other components, steps, operation and/or existence or addition of elements are not excluded in addition to the described components, steps, operation and/or elements unless context dictates otherwise.

Hereinafter, a domain wall memory 100 will be described with reference to FIGS. 1A and 1B.

Figure 1B:
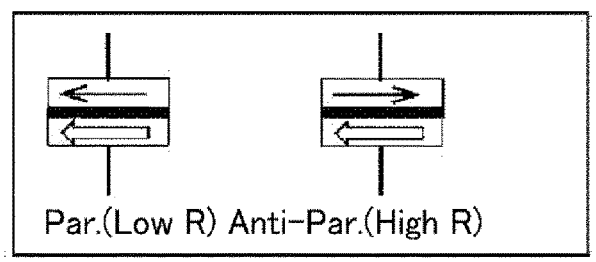

FIGS. 1A and 1B are a set of block diagram which are useful for understanding a domain wall memory 100.

The domain wall memory 100 includes a magnetic nanowire 130. Further, the domain wall memory 100 may include a magnetic tunnel junction 140 such as a write head 110 and a read head 120.

The magnetic nanowire 130 may include a bit-cell in the form of magnetic polarity. Through the bit-cell, the magnetic nanowire 130 may have multiple bits. Therefore, the domain wall memory 100 can provide high density.

Further, the magnetic nanowire 130 is analogous to a shift register. Generally, the magnetic nanowire 130 includes multiple physical notches to move the domain wall in lockstep fashion. Herein, the domain wall does not land in between two physical notches. A shift pulse is enough to dislodge the domain wall, and can shift along the magnetic nanowire 130.

The magnetic tunnel junction 140 such as the write head 110 and the read head 120 may be formed between the magnetic nanowire 130 and a fixed magnetic layer. The magnetic tunnel junction 140 may be separated by a tunnel oxide barrier. By way of example, the left magnetic orientation in the magnetic nanowire 130 can be regarded as "0" and the right magnetic orientation in the magnetic nanowire 130 can be regarded as "1".

As such, the magnetic nanowire 130 may form a domain wall 150 between domains of opposite polarities. The domain wall 150 may be shifted to the right or to the left by injecting a charge current to SHIFT+ 160 and SHIFT− 161 contacts.

Therefore, the domain wall memory 100 injects a current through the SHIFT+ 160 and the SHIFT− 161 as shift lines in order to perform a shift operation. Herein, the domain wall memory 100 may shift existing bits in lockstep fashion. The domain wall memory 100 may write a bit, which is desired to be written in the magnetic nanowire 130, through the write head to the magnetic nanowire 130.

To be specific, the domain wall memory 100 injects a spin polarized current through the write head 120 in a positive or negative direction to write a "1" or "0" in the nanowire 130. Herein, the write head 120 may use a write bit line 171 and any one of the SHIFT+ 160 and the SHIFT− 161.

The writing in a write operation involves a current which induces a spin-transfer torque to flip the magnetization of a free layer. A read operation is performed by bringing the desired bit to a cell combined with the read head 110 through a shift operation and then sensing a resistance formed by the domain wall under the read head 110. In this regard, a resistance of the magnetic tunnel junction 140 is high when the fixed layer and the free layer are in anti-parallel configuration, whereas a resistance of the magnetic tunnel junction 140 is low when these layers are parallel to each other.

In the domain wall memory 100, a write operation and a read operation include a shift operation. Therefore, if the read operation is performed to bits shifted after the write operation, the bits can be shifted back to an initial state.

Herein, the worst case latency for random access in the domain wall memory 100 may be the sum of a number of shifts and write/read latency. However, in the case of employing serial access, the latency for serial access in the domain wall memory 100 may be the sum of a single shift and write/read latency.

Hereinafter, a memory device based on a domain wall memory 200 will be described with reference to FIG. 2 to FIG. 5B.

Figure 2:
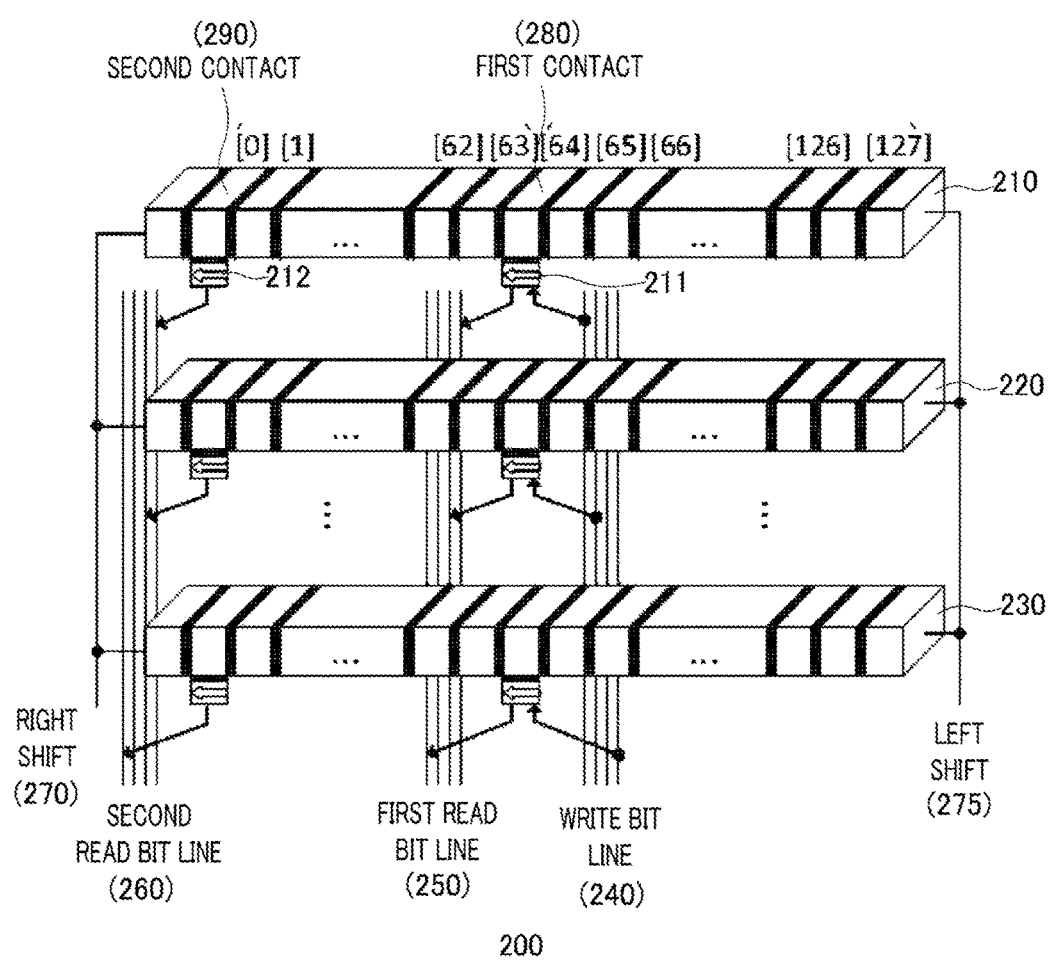
FIG. 2 is a block diagram of the memory device based on a domain wall memory which is useful for understanding an exemplary embodiment of the present disclosure.

FIG. 2 is a block diagram of the memory device based on a domain wall memory 200 which is useful for understanding an exemplary embodiment of the present disclosure.

The memory device based on a domain wall memory 200 may include one or more magnetic nanowires 210, 220, and 230 including multiple cells.

Further, each of the magnetic nanowires 210, 220, and 230 may include multiple cells. The magnetic nanowires 210, 220, and 230 may include one or more of a read-only head 212, a write-only head (not illustrated), and a read-write head 211 combined with cells at specific contacts of the magnetic nanowires 210, 220, and 230. Herein, the read-write head 211 may store or output data through a write head or a read head included in the read-write head 211.

Furthermore, the memory device 200 may include read bit lines 250 and 260 connected to the read head and a write bit line 240 connected to the write head. Moreover, the memory device 200 may include a right shift 270 and a left shift 275 connected to each of the magnetic nanowires 210, 220, and 230 in order to support low-power shift.

Further, the memory device 200 may classify data depend on a data input/output method and the number of cells where data are input and output.

Generally, a memory input/output method may be classified into a first in first out (FIFO) method and a last in first out (LIFO) method depend on an output order of input data.

Further, the number of input/output cells in a memory may be classified into a single input-single output (SISO) method, a single input-parallel output (SIPO) method, and so on.

Hereinafter, an input/output method which can be performed at the time of performing a single input to the domain wall memory-based memory device 200 in accordance with an exemplary embodiment of the present disclosure will be described with reference to FIGS. 3A to 3D. Herein, FIGS. 3A to 3D are just an example, but does not limit the data input/output method and the number of input/output cells in the memory device 200.

FIGS. 3A to 3D are a set of exemplary diagrams of classification dependent on an input/output method and the number of input/output cells with respect to the memory device 200 which are useful for understanding certain aspects of the present disclosure.

Figure 3A:
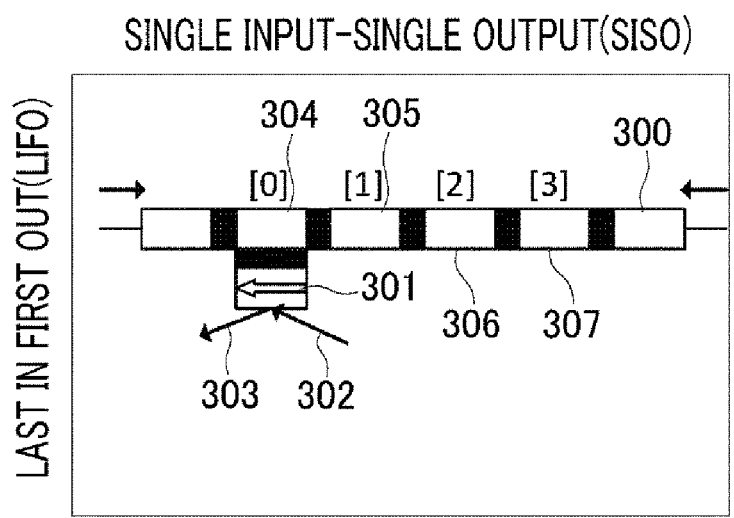
FIGS. 3A to 3D are a series of exemplary diagrams of classification dependent on an input/output method and the number of input/output cells with respect to the memory device which is useful for understanding an exemplary embodiment of the present disclosure.

FIG. 3A is an exemplary diagram illustrating a case where the single input-single output method is performed by LIFO in the memory device 200.

The memory device 200 may include a magnetic nanowire 300 and a read-write head 301 combined with a first cell 304 of the magnetic nanowire 300. The memory device 200 may write a first data in a first cell 304 using a write head 302 included in the read-write head 301.

The memory device 200 may write a second data following the first data in the first cell 304 corresponding to the read-write head 301. Herein, in order to suppress the previously stored first data from being erased by the second data, the memory device 200 may perform a shift operation to the magnetic nanowire 300. By way of example, if the memory device 200 performs a right shift operation after a write operation, the memory device 200 may shift the first data to a second cell 305. Then, the memory device 200 may write the second data in the first cell 304.

If the memory device 200 writes a third data and a fourth data in sequence as described above, the magnetic nanowire of the memory device 200 may store the fourth data in the first cell 304, the third data in the second cell 305, the second data in a third cell 306, and the first data in a fourth cell 307.

After the writing of the first data is completed, the memory device 200 may read data stored in the first cell 304 on the basis of the read head 303 included in the read-write head 301. After reading the data, the memory device 200 may perform a shift operation to read data stored in the second cell 305. Herein, the memory device 200 may perform a left shift operation. That is, the memory device 200 may shift data stored in each cell to store the third data in the first cell 304 corresponding to the read-write head 301. Further, the memory device 200 may read the third data on the basis of the read head 303 included in the read-write head 301.

In this way, the memory device 200 may read the fourth data, the third data, the second data, and the first data in sequence. That is, the memory device 200 may read the data in reverse order to the order of the written data.

Figure 3B:
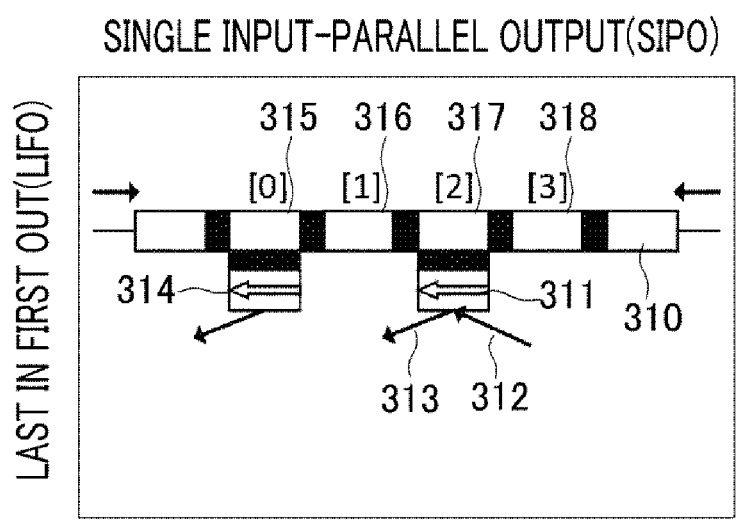

FIG. 3B is an exemplary diagram illustrating a case where the single input-parallel output method is performed by LIFO in the memory device 200.

For LIFO and single input-parallel output, the memory device 200 may include a magnetic nanowire and a read-only head and a read-write head combined with specific contacts of the magnetic nanowire.

By way of example, if there are four cells on a magnetic nanowire 310, a read-only head 314 may be combined with a first cell 315 of the magnetic nanowire 310. Further, a read-write head 311 may perform write and read operations to a third cell 317 and a fourth cell 318 of the magnetic nanowire 310.

That is, the memory device 200 may write a first data in the third cell 317 through a write head 312 included in the read-write head 311. Further, the memory device 200 may perform a right shift operation of the magnetic nanowire 310. Therefore, the first data stored in the third cell 317 may be shifted to the fourth cell 318. Further, the memory device 200 may write a second data in the third cell 317 through the write head 312 included in the read-write head 311.

The memory device 200 may perform a left shift operation of the magnetic nanowire 310 to shift the second data stored in the third cell 317 to a second cell 316 and shift the first data stored in the fourth cell 318 to the third cell 317. Then, the memory device 200 may read the first data stored in the third cell 317 through a read-only head 313.

After reading the first data, the memory device 200 may perform a left shift operation of the magnetic nanowire. That is, the second data may be stored in the first cell 315 of the magnetic nanowire and the first data may be stored in the second cell 316.

The memory device 200 may read the second data stored in the first cell 315 on the basis of a read-only head connected to the first cell 315. After reading the second data, the memory device 200 may perform a left shift operation. Then, the memory device 200 may read the first data stored in the first cell 315 on the basis of the read-only head connected to the first cell 315.

In this way, the memory device 200 may write the first data and the second data in sequence, and read the second data and the first data in sequence twice.

Figure 3C:
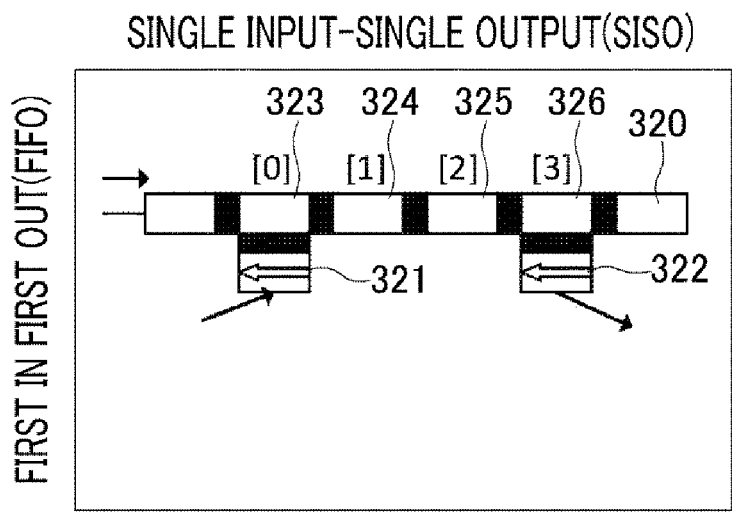

FIG. 3C is an exemplary diagram illustrating a case where the single input-single output method is performed by FIFO in the memory device 200.

For FIFO and single input-single output, the memory device 200 may include a magnetic nanowire 320, a write-only head 321 connected to a specific cell on the magnetic nanowire 320, and a read-only head 322 connected to a specific cell on the magnetic nanowire.

The memory device 200 may write data through the write-only head 321 and read data through the read-only head 322. Further, after reading data, the memory device 200 may perform a shift operation.

To be specific, the memory device 200 may input a first data into a first cell 323 through the write-only head 321 combined with the first cell 323. The memory device 200 may read data stored in a fourth cell 326 on the basis of the read-only head 322 combined with the fourth cell 326 and perform a shift operation. Herein, since there is no data stored in the fourth cell 326, the memory device 200 may perform a shift operation only. If the memory device 200 performs a right shift operation, the memory device 200 may shift the first data stored in the first cell 323 to a second cell 324.

Then, the memory device 200 may write a second data and a third data in sequence in the first cell 323 through the write-only head 321 and perform a shift operation. After performing the shift operation, the memory device 200 may store the third data in the second cell 324, the second data in the third cell 325, and the first data in the fourth cell 326.

After writing a fourth data in the first cell 323, the memory device 200 may read the first data stored in the fourth cell 326 on the basis of the read-only head 322 connected to the fourth cell 326. Then, the memory device 200 may perform a shift operation.

In this way, it is possible to set a certain delay between the write-only head 321 and the read-only head 322. As such, the memory device 200 may perform a FIFO operation with a certain delay between input and output.

Figure 3D:
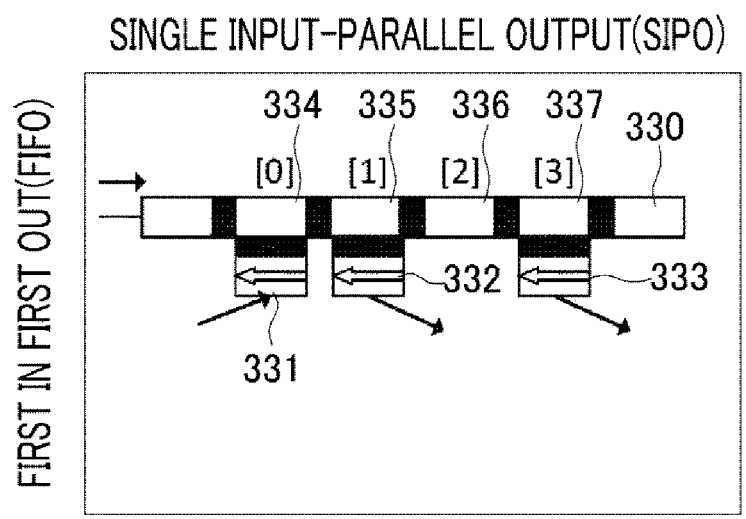

FIG. 3D is an exemplary diagram illustrating a case where the single input-parallel output method is performed by FIFO in the memory device 200.

For FIFO and single input-parallel output, the memory device 200 may include a magnetic nanowire 330, a write-only head 331 combined with a specific cell of the magnetic nanowire 330, and multiple read-only heads 332 and 333 combined with a specific cell of the magnetic nanowire 330.

The memory device 200 may write data in the magnetic nanowire 330 through the write-only head 331 and read the data written in the magnetic nanowire 330 through the multiple read-only heads 332 and 333. Further, after reading the data, the memory device 200 may perform a shift operation.

By way of example, if there are four cells on the magnetic nanowire 330, the write-only head 331 of the memory device 200 may write data in a first cell 334 connected to the write-only head 331 and perform a right shift operation. Further, the first read-only head 332 and the second read-only head 333 may read data written in a second cell 335 and a fourth cell 337 respectively connected thereto and perform a shift operation in the same direction as the write-only head 331.

As such, the memory device 200 may perform parallel FIFO operations with a certain delay between write and read. Further, the memory device 200 may perform parallel output operations using the multiple read-only heads 332 and 333.

The memory device 200 which is useful for understanding an exemplary embodiment of the present disclosure may be a survivor memory 450 included in a Viterbi decoder 400.

Figure 4:
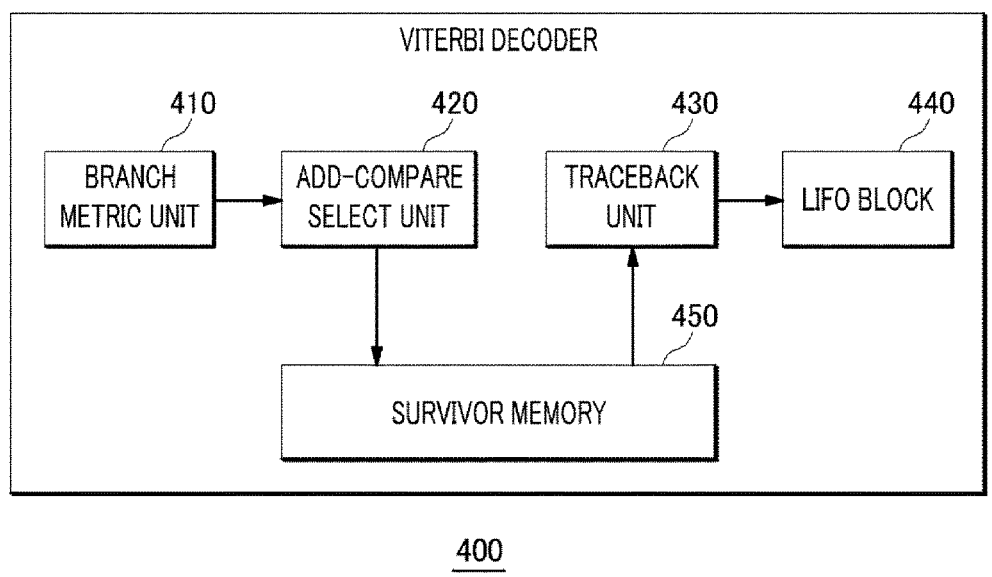
FIG. 4 is a block diagram of the Viterbi decoder which is useful for understanding an exemplary embodiment of the present disclosure.

FIG. 4 is a block diagram of the Viterbi decoder 400 which is useful for understanding an exemplary embodiment of the present disclosure.

The Viterbi decoder 400 may perform a maximum likelihood decoding operation for convolutional codes. In the Viterbi decoder 400, the convolutional codes may be modeled as a trellis diagram. Herein, in the trellis diagram, a serial of input incurs continuous state transitions, and the footprint of state transitions may be decoded as a correct path among all possible paths. In the Viterbi decoder 400, all paths entering each state in the trellis diagram may be evaluated and compared to recover the original input sequence.

The Viterbi decoder 400 may include a branch metric unit (BMU) 410, an add-compare select unit (ACSU) 420, a traceback unit (TBU) 430, a LIFO processing unit 440, and the survivor memory 450.

The branch metric unit 410 calculates a distance between a received symbol included in a digital signal and a previously stored symbol. Herein, the branch metric unit 410 may use a Euclidean distance.

The add-compare select unit 420 may accumulate distances of all possible paths to select a path in the trellis diagram. The add-compare select unit 420 may compare the accumulated values and generate decision bits. Herein, the generated decision bits may be stored in the domain wall memory.

The traceback unit 430 generates a survivor path by performing a traceback operation while checking the decision bits stored in the domain wall memory. Herein, the traceback unit 430 may trace back the survivor path to D stages depend on a predetermined traceback depth.

The Viterbi decoder 400 may store the decision bits generated by the add-compare select unit 420 in the domain wall memory. Further, the Viterbi decoder 400 may trace back the survivor path and perform decoding and reading with the stored decision bits through the traceback unit 430.

Herein, the Viterbi decoder 400 may use the memory device 200 as the survivor memory 450. That is, the memory device 200 may output data about the survivor path to be input into the traceback unit 430 through a read head included in a write-read head in response to traceback read operations.

To be specific, referring to FIG. 2 again, the first magnetic nanowire 210 of the memory device 200 includes the read-write head 211 combined with a first contact 280 of the first magnetic nanowires 210 and the read-only head 212 combined with a second contact 290.

Further, the memory device 200 may include one or more write bit lines 240 and one or more read bit lines 250 and 260. Herein, the read head included in the read-write head 211 may be combined with the first read bit line 250 and the read-only head 212 may be combined with the second read bit line 260. Further, a write head included in the read-write head 211 may be combined with the write bit lines 240.

The memory device 200 stores data in a cell of the magnetic nanowire 210 through the write head included in the read-write head 211. Herein, the memory device 200 may store data from the first contact 280 combined with the read-write head 211 to a first side end through a shift operation.

The memory device 200 reads the data stored in the cell of the magnetic nanowire 210 in sequence in response to the LIFO method through the read head included in the read-write head 211. Herein, the memory device 200 may shift the read data in sequence through a shift operation. The shift operation used in the read operation may be performed in the opposite direction to the direction of the shift operation used in the write operation. By way of example, if the shift operation used in the read operation is the right shift 270, the shift operation used in the write operation may be the left shift 275.

Therefore, the memory device 200 may store data, which are stored in cells included between the first contact 280 and the first side end of the magnetic nanowire 210, into respective cells from the second contact 290 to a contact just before the first contact 280 in sequence through a read operation in response to the LIFO method.

Herein, the number of the cells included between the first contact 280 and the first side end of the magnetic nanowire 210 may be the same as the number of the cells from the second contact 290 to the contact just before the first contact 280. By way of example, the number of the cells included between the first contact 280 and the first side end of the magnetic nanowire 210 may be 64. Therefore, the magnetic nanowire 210 may include 128 cells.

Further, the memory device 200 may read the data stored in the second contact 290 in response to the LIFO method through the read-only head 212 combined with the second contact 290 of the magnetic nanowire 210. Herein, the memory device 200 may shift the read data in sequence through a shift operation.

Figure 5A:
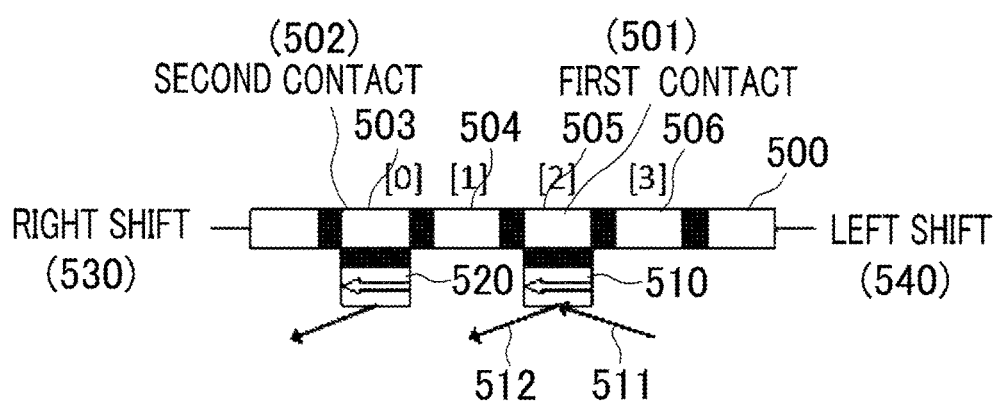
FIGS. 5A and 5B are a series of exemplary diagrams of a signal processing process of the survivor memory in the Viterbi decoder which is useful for understanding an exemplary embodiment of the present disclosure.
Figure 5B:
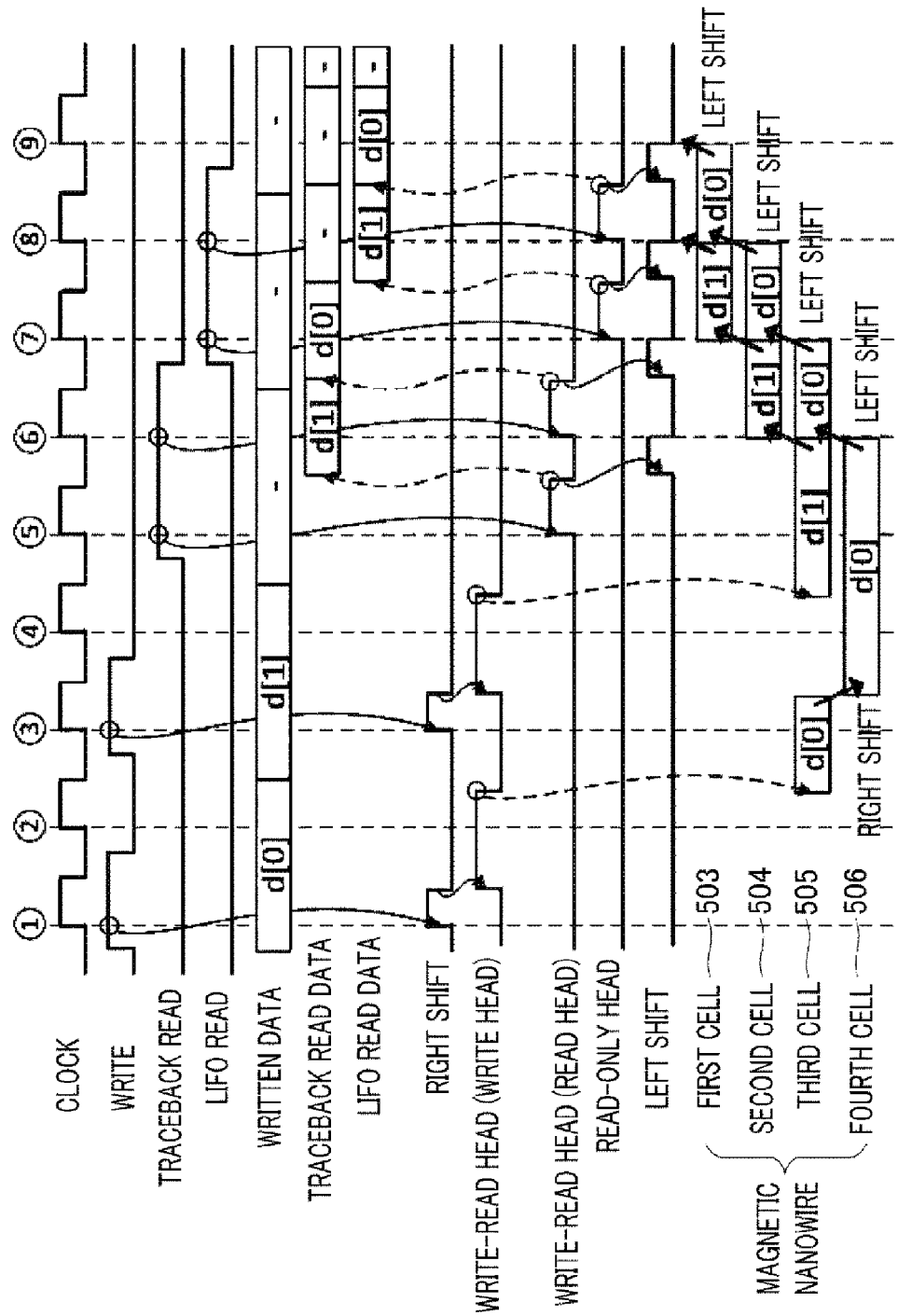

FIGS. 5A and 5B are a series of exemplary diagrams which are useful for understanding a signal processing process of the survivor memory 450 in the Viterbi decoder.

By way of example, the memory device 200 may include a magnetic nanowire 500 including four cells 503, 504, 505 and 506. Herein, a write-read head 510 may be combined with a third cell 505 among the four cells and a read-only head may be combined with a first cell 503.

Herein, the memory device 200 may store data in the magnetic nanowire 500 in sequence through a right shift operation by a write head 511 of the write-read head 510 combined with a first contact 501 of the magnetic nanowire 500. That is, the memory device 200 may write a first data and a second data from the third cell 505, which is the first contact 501 of the magnetic nanowire 500, to the fourth cell 506, which is a right side end of the magnetic nanowire 500. That is, the second data is written in the third cell 505 and the first data is written in the fourth cell 506.

Further, the memory device 200 may read the data written in the magnetic nanowire 500 in sequence through a left shift operation by a read head 512 of the write-read head 510. Herein, the read data may be stored in cells from a second contact 502 to a contact just before the first contact 501 through a left shift operation. That is, data to be read may be the data stored from the third cell 505 to the fourth cell 506.

A read operation performed by the write-read head 510 may be a traceback read. To be specific, the memory device 200 may read the second data first through the write-read head 510. Then, the memory device 200 may store the second data in the second cell 504 and the first data in the third cell 505 through a left shift operation. The memory device 200 may read the first data through the write-read head 510. Then, the memory device 200 may store the second data in the first cell 503 and the first data in the second cell 504 through a shift operation.

The memory device 200 may read the data in sequence through the left shift operation by the read-only head combined with the first cell 503 which is the second contact 502.

Further, a read operation performed by a read-only head 520 may be a LIFO read. Herein, the LIFO read may be decoding and reading.

To be specific, the memory device 200 may read the second data stored in the first cell 503 combined with the read-only head 520. Then, the memory device 200 may perform a left shift operation. If the left shift operation is completed, the memory device 200 may store the first data in the first cell 503. Therefore, the memory device 200 may read the first data stored in the first cell 503 on the basis of the read-only head 520.

As such, the memory device 200 may read "the second data and the first data" in sequence twice through a traceback read and a LIFO read.

Hereinafter, a digital signal processor which is useful for understanding an exemplary embodiment of the present disclosure will be described with reference to FIG. 6 to FIG. 12B.

Figure 6:
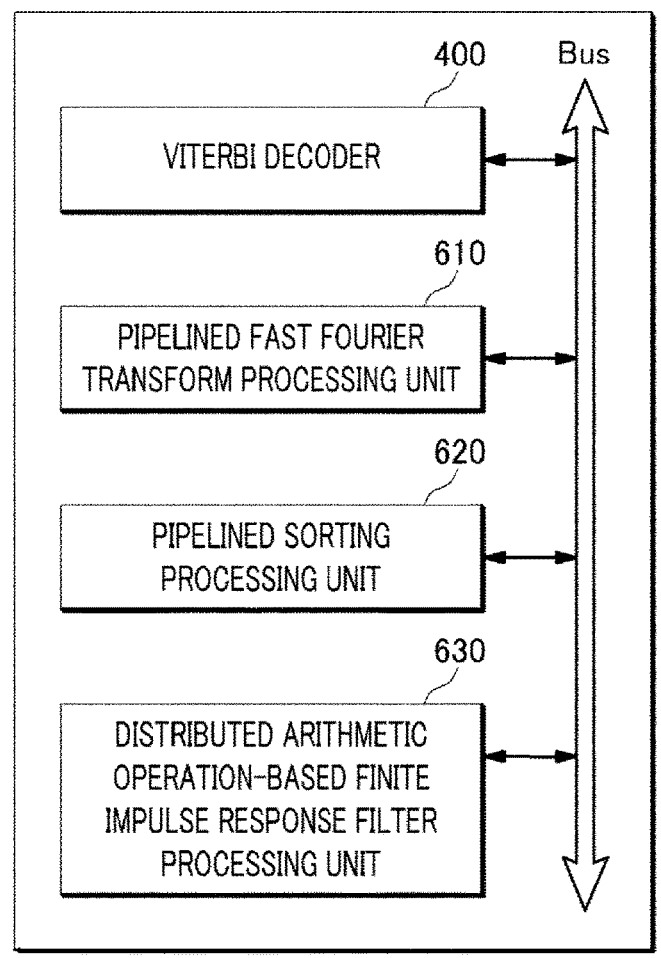
FIG. 6 is a block diagram of a digital signal processor 600 which is useful for understanding an exemplary embodiment of the present disclosure.

FIG. 6 is a block diagram of a digital signal processor 600 which is useful for understanding an exemplary embodiment of the present disclosure.

The digital signal processor 600 includes the Viterbi decoder 400.

Herein, the Viterbi decoder 400 includes the survivor memory 450 as described above. The survivor memory 450 is a domain wall memory and includes at least one magnetic nanowire including multiple cells, a write-read head combined with a first contact of the magnetic nanowire, and a read-only head combined with a second contact of the magnetic nanowire.

Herein, data stored through a write head included in the write-read head may be read in sequence through a read head included in the write-read head in response to the LIFO method. Further, the data stored through the write head included in the write-read head may be output for tracing back a survivor path through the read head included in the write-read head in response to a traceback read operation of the Viterbi decoder 400.

If the Viterbi decoder 400 performs a read operation in response to the LIFO method through the write-read head, data stored in cells included between the first contact and a first side end of the magnetic nanowire may be stored into respective cells from the second cell to a contact just before the first contact in sequence.

The Viterbi decoder 400 may perform a read operation in response to the LIFO method through the read-only head combined with the second contact.

Two clocks may be assigned for a write operation which is generally known as being slower than a read operation. Therefore, in the Viterbi decoder 400, a write operation and a shift operation may be performed in two clock cycles and a read operation and a shift operation may be performed in one clock cycle.

Meanwhile, the digital signal processor 600 may further include the LIFO processing unit 440. Herein, the LIFO processing unit 440 may be included in the Viterbi decoder 400 as described above with reference to FIG. 4. Otherwise, the LIFO processing unit 440 may be connected to the Viterbi decoder 400 and configured to receive a signal processed by the Viterbi decoder 400 as an input, but may not be limited thereto. The LIFO processing unit 440 will be described with reference to FIG. 7.

Figure 7:
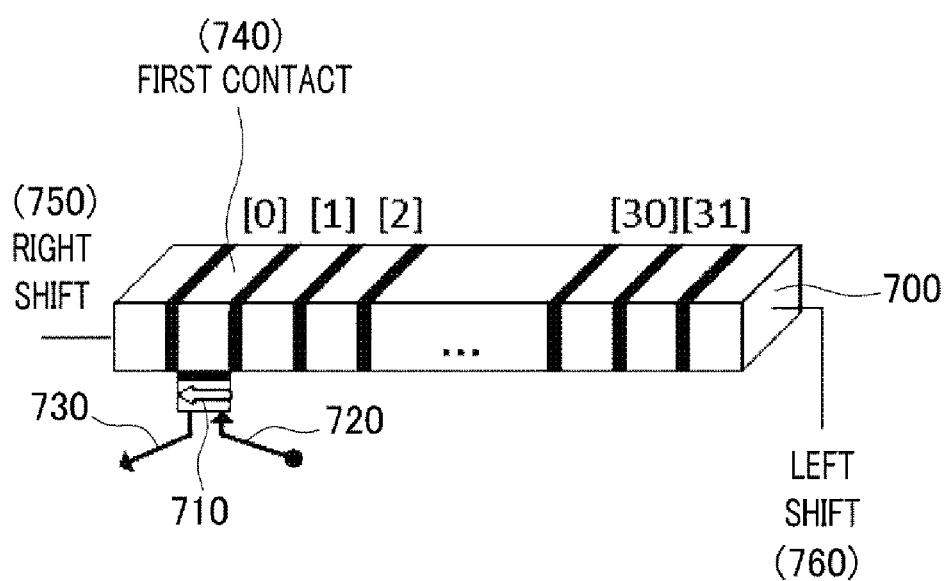
FIG. 7 is an exemplary diagram of a LIFO block which is useful for understanding an exemplary embodiment of the present disclosure.

FIG. 7 is an exemplary diagram of a LIFO block which is useful for understanding an exemplary embodiment of the present disclosure.

The Viterbi decoder 400 may generate n number of data in each even clock cycle and generate n number of data in each odd clock cycle through the add-compare select unit 420 included in the Viterbi decoder 400. Herein, n number of data generated in each clock cycle may be decision bits.

That is, the Viterbi decoder 400 may generate 2n number of bits by combining the n number of data generated in the even clock cycle with the n number of data generated in the odd clock cycle.

That is, the Viterbi decoder 400 may generate 2n number of data through a traceback operation. Herein, the generated 2n number of data are stored in reverse order. Therefore, the Viterbi decoder 400 needs to arrange the data in reverse order to be in right order.

In order to arrange the data in reverse order to be in right order, the LIFO processing unit 440 of the general Viterbi decoder 400 may include a shift register (SHREG) including multiple cells. Herein, the shift register may be a bidirectional shift register capable of performing right and left shift operations.

Further, the shift register may include a ping register and a pong register. The ping register may write data in the shift register through a shift operation performed in a predetermined direction. Further, if the writing of the data is completed, the pong register may read the data through a shift operation performed in the opposite direction to the predetermined direction.

By way of example, the shift register may write data in the shift register through a right shift operation. If the writing of the data is completed, the shift register may switch the shift direction and then read the data in the shift register through a left shift operation. Further, if the reading of the data is completed, the shift register may switch the shift direction again and then write the data in the shift register through a right shift operation. As such, the shift register may perform data write and read operations by switching a shift direction.

The LIFO processing unit 440 which is useful for understanding an exemplary embodiment of the present disclosure may include a LIFO block in order to change the order of traceback data in reverse order outputted by the Viterbi decoder 400 to be a right order. Herein, the LIFO block may substitute for the shift register of the general Viterbi decoder 400.

The LIFO block is a domain wall memory and includes a magnetic nanowire 700, a write-read head 710 of the LIFO block combined with a first contact 740 of the magnetic nanowire 700, a read bit line, a write bit line, and multiple shifts. Further, the magnetic nanowire 700 may include multiple cells.

By way of example, a shift register including 64 cells may be substituted by two magnetic nanowires each including 32 cells. In this way, the Viterbi decoder 400 may solve a possible delay through a shift operation corresponding to a write operation.

Figure 8A:
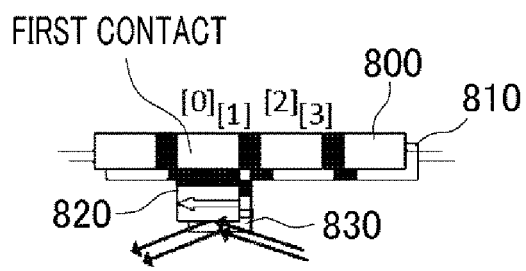
FIGS. 8A and 8B are a series of exemplary diagrams of data write and read processes of a LIFO block which is useful for understanding an exemplary embodiment of the present disclosure.
Figure 8B:
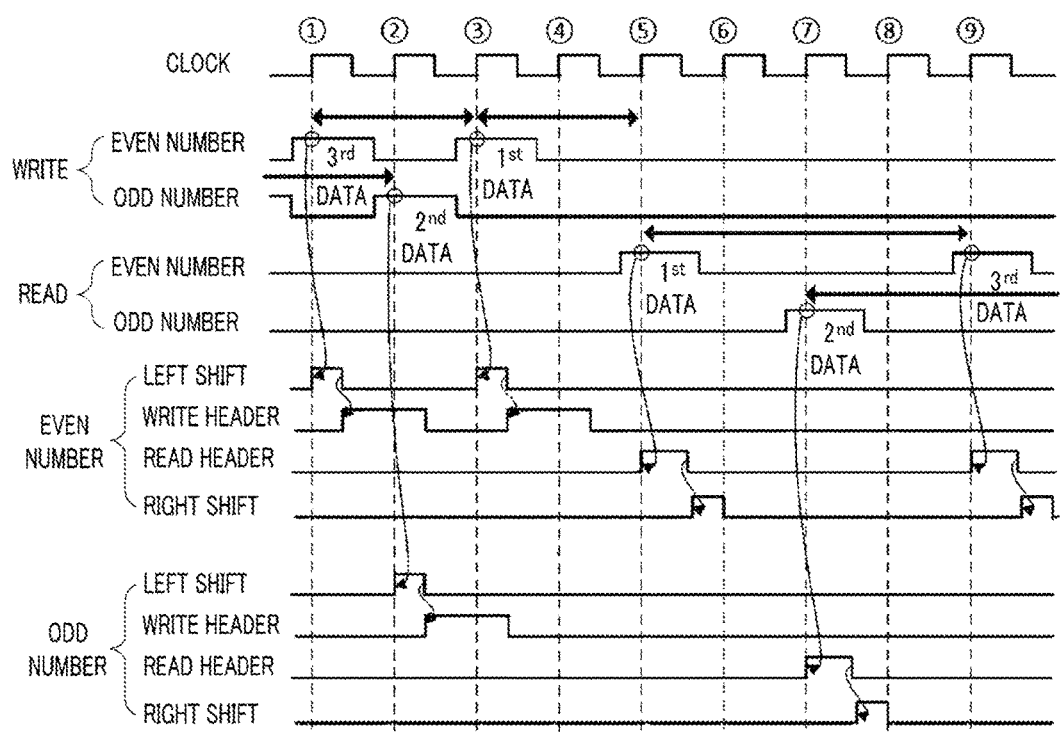

The LIFO processing unit 440 may store data in the magnetic nanowire through the write-read head of the LIFO block by a method similar to that of the write-read head of the Viterbi decoder 400. Further, the LIFO processing unit 440 may read the data in sequence through a read head included in the write-read head of the LIFO block by the method similar to that of the write-read head of the Viterbi decoder 400 in response to the LIFO method. Referring to FIGS. 8A and 8B, data write and read processes of the LIFO processing unit 440 will be described in detail.

FIGS. 8A and 8B are an exemplary diagram of data write and read processes of a LIFO block which are useful for understanding an exemplary embodiment of the present disclosure.

To be specific, as shown in FIG. 8A, the LIFO block of the LIFO processing unit 440 may include two magnetic nanowires 800 and 810 each including two cells. Herein, the magnetic nanowires 800 and 810 included in the LIFO block may include a first magnetic nanowire 800 corresponding to an even clock and a second magnetic nanowire 810 corresponding to an odd clock cycle.

Further, the LIFO block may include a first write-read head 820 combined with a first contact of the first magnetic nanowire and a second write-read head 830 combined with a first contact of the second magnetic nanowire.

The LIFO block may write the stored data through a right shift operation by write heads included in the write-read heads 820 and 830 combined with the magnetic nanowires, respectively. Herein, the LIFO block may perform a right shift operation in an even clock cycle and then write a third data in the first magnetic nanowire 800 through the write head of the first write-read head 820.

The LIFO block may perform a right shift operation in an odd clock cycle and then write a second data in the second magnetic nanowire 810 through the write head of the second write-read head 830. As such, the LIFO block may write data in the respective magnetic nanowires in an even clock cycle and an odd clock cycle.

After the writing of the data in the first magnetic nanowire 800 and the second magnetic nanowire 810 is completed, the LIFO block may read the stored data through a left shift operation by read heads respectively included in the write-read heads 820 and 830. Herein, the data are read by the LIFO block in reverse order to the order of writing.

Meanwhile, the digital signal processor 600 may further include a pipelined fast Fourier transform (FFT) processing unit 610 and a pipelined sorting processing unit 620.

Herein, the pipelined FFT processing unit 610 may perform a butterfly operation and a twiddle factor multiplication operation.

Further, the pipelined sorting processing unit 620 may perform real-time sorting of data inputted in sequence. By way of example, the pipelined sorting processing unit 620 may perform fast real-time sorting based on the bitonic sorting algorithm.

The pipelined FFT processing unit 610 and the pipelined sorting processing unit 620 may include a FIFO register file. Herein, the FIFO register file may be a domain wall memory. Further, the FIFO register file may include a magnetic nanowire, a write-only head, and a read-only head.

The magnetic nanowire of the FIFO register file may include multiple cells. By way of example, the number of the multiple cells may be 32.

Further, the write-only head may be combined with a first contact of the magnetic nanowire of the FIFO register file. Furthermore, the read-only head may be combined with a second contact of the magnetic nanowire of the FIFO register file.

Figure 9:
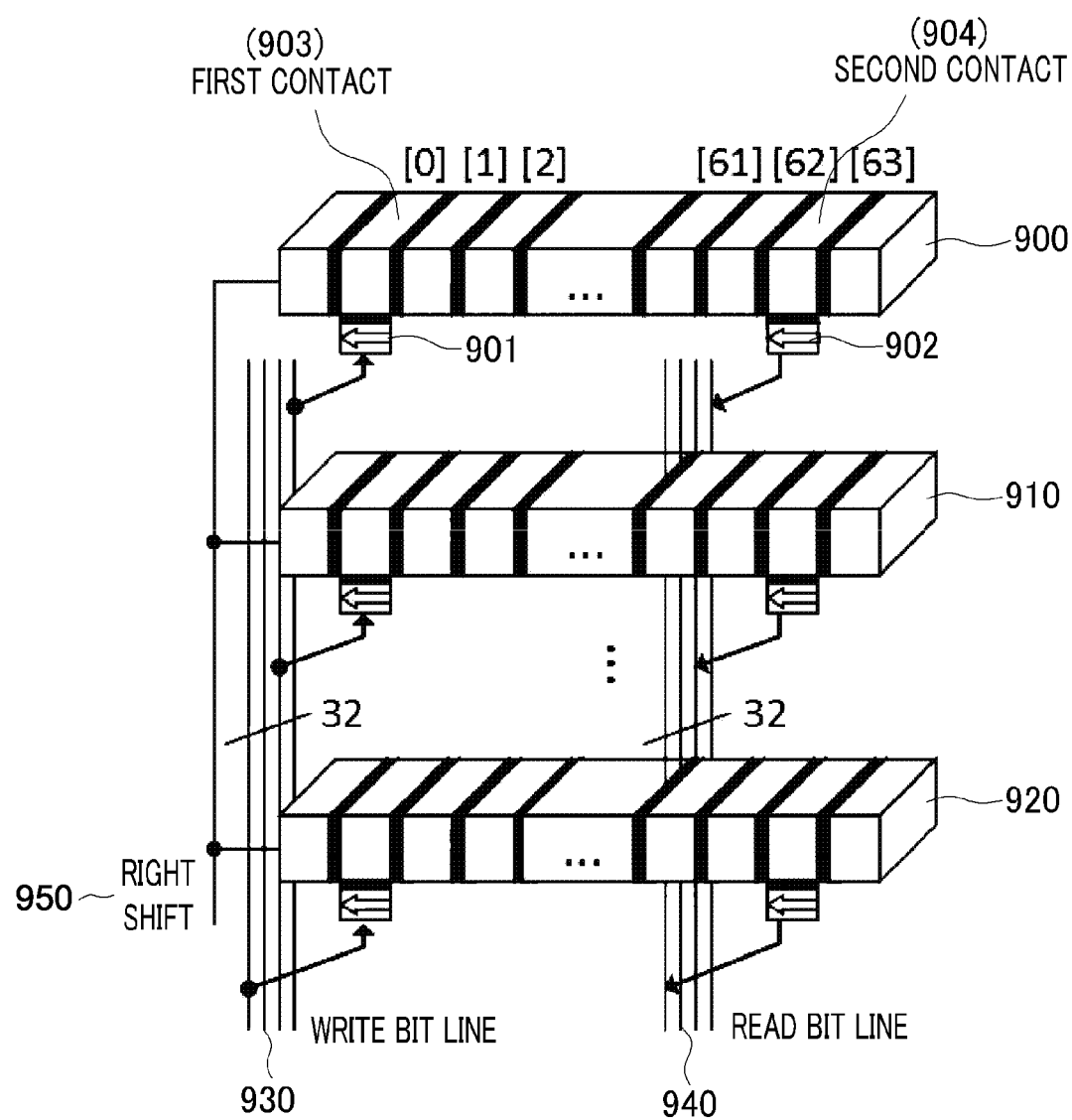
FIG. 9 is an exemplary diagram of a FIFO register file which is useful for understanding an exemplary embodiment of the present disclosure.

FIG. 9 is an exemplary diagram of a FIFO register file which is useful for understanding an exemplary embodiment of the present disclosure Referring to FIG. 9, the FIFO register file may include multiple magnetic nanowires 900. Further, each of the magnetic nanowires 900 may include a write-only head 901 combined with a first contact 903 and a read-only head 902 combined with a second contact 904

The FIFO register file may include a write bit line 930 connected to the write-only head 901 and a read bit line 940 connected to the read-only head 902.

Figure 10A:
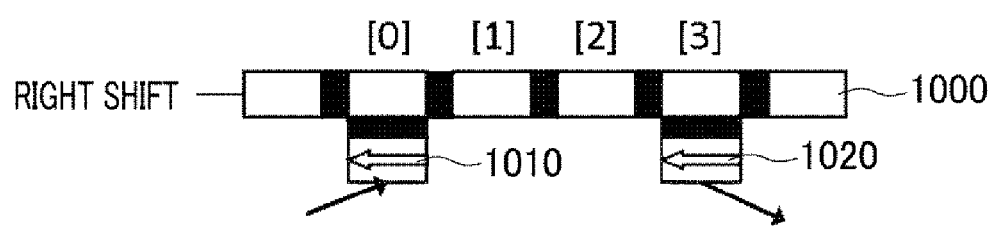

The FIFO register file may include a unidirectional shift 950 since data are written and read in one direction. Referring to FIGS. 10A and 10B, data write and read processes of the FIFO register file will be described in detail.

FIGS. 10A and 10B are set of exemplary diagrams which are useful for understanding data write and read processes of the FIFO register file in an exemplary embodiment of the present disclosure.

Referring to FIG. 10A, the FIFO register file may write a first data in a cell combined with a write-only head 1010 through the write-only head 1010 included in the FIFO register file. Further, the FIFO register file may read data from a cell combined with a read-only head 1020 through the read-only head 1020 of the FIFO register file. Since there is no data stored in the cell combined with the read-only head 1020, no data is read. The FIFO register file may perform a read operation and then perform a shift operation.

The FIFO register file may write a second data, a third data, and a fourth data in response to the above-described method of writing the first data. Further, if the first data is shifted to the cell combined with the read-only head 1020, the FIFO register file may read the first data through a read head of the read-only head 1020.

As such, in the FIFO register file, the written data may be read with a delay depend on positions of the write-only head and the read-only head.

Further, the digital signal processor 600 may further include a distributed arithmetic (DA) operation-based finite impulse response filter processing unit 630. The DA operation-based finite impulse response filter processing unit 630 may perform an operation of dividing an input or a coefficient by bit unit and accumulating the result through a distributed arithmetic operation. Therefore, the DA operation-based finite impulse response filter processing unit 630 may perform a filtering operation without a multiplier.

Figure 11:
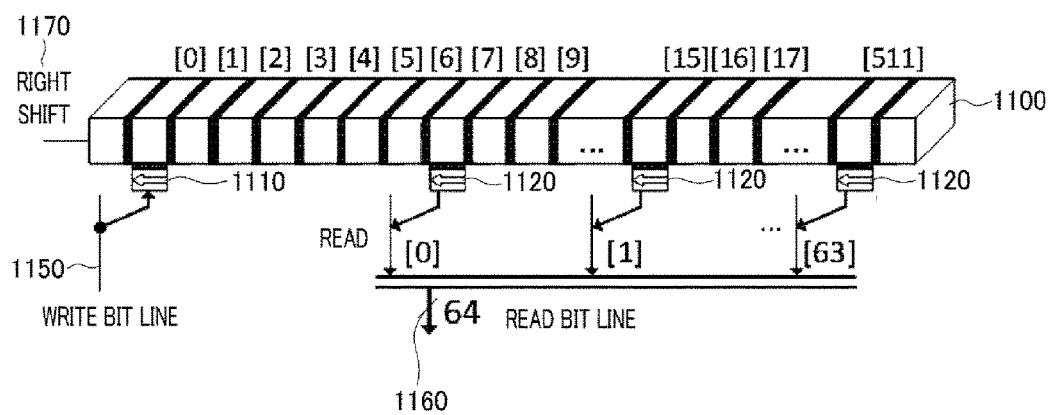
FIG. 11 is an exemplary diagram of an input register which is useful for understanding an exemplary embodiment of the present disclosure.

FIG. 11 is an exemplary diagram of an input register which is useful for understanding an exemplary embodiment of the present disclosure.

The DA operation-based finite impulse response filter processing unit 630 may include an input register. Herein, the input register may be a domain wall memory. The input register may include a magnetic nanowire 1100, a write-only head 1110, and multiple read-only heads 1120.

The write-only head 1110 may be combined with a first contact of the magnetic nanowire of the input register. Further, each of the multiple read-only heads 1120 may be combined with a certain contact of the magnetic nanowire of the input register. Herein, the certain contact connected to the read-only head 1120 may be different from the first contact on the magnetic nanowire and the contacts connected to the other read-only heads.

Further, the input register may include a write bit line 1150 connected to the write-only head 1110 and a read bit line 1160 connected to the multiple read-only heads 1120.

By way of example, the input register may include one read-only head 110 and 64 read-only heads 1120 configured to read 64 data in order to generate a 64-bit address.

Figure 12A:
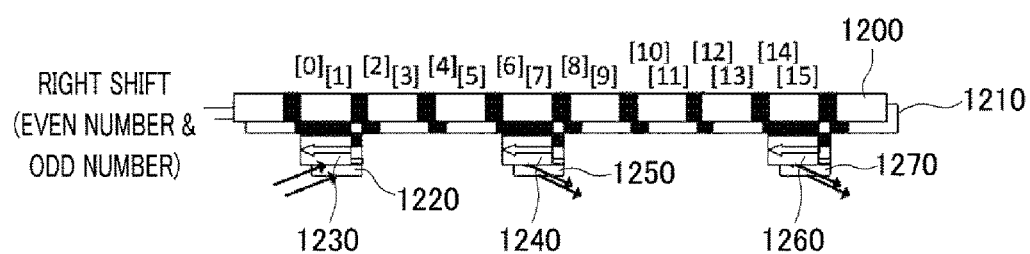
FIGS. 12A and 12B are a series of exemplary diagrams of data write and read processes of the input register which is useful for understanding an exemplary embodiment of the present disclosure.
Figure 12B:
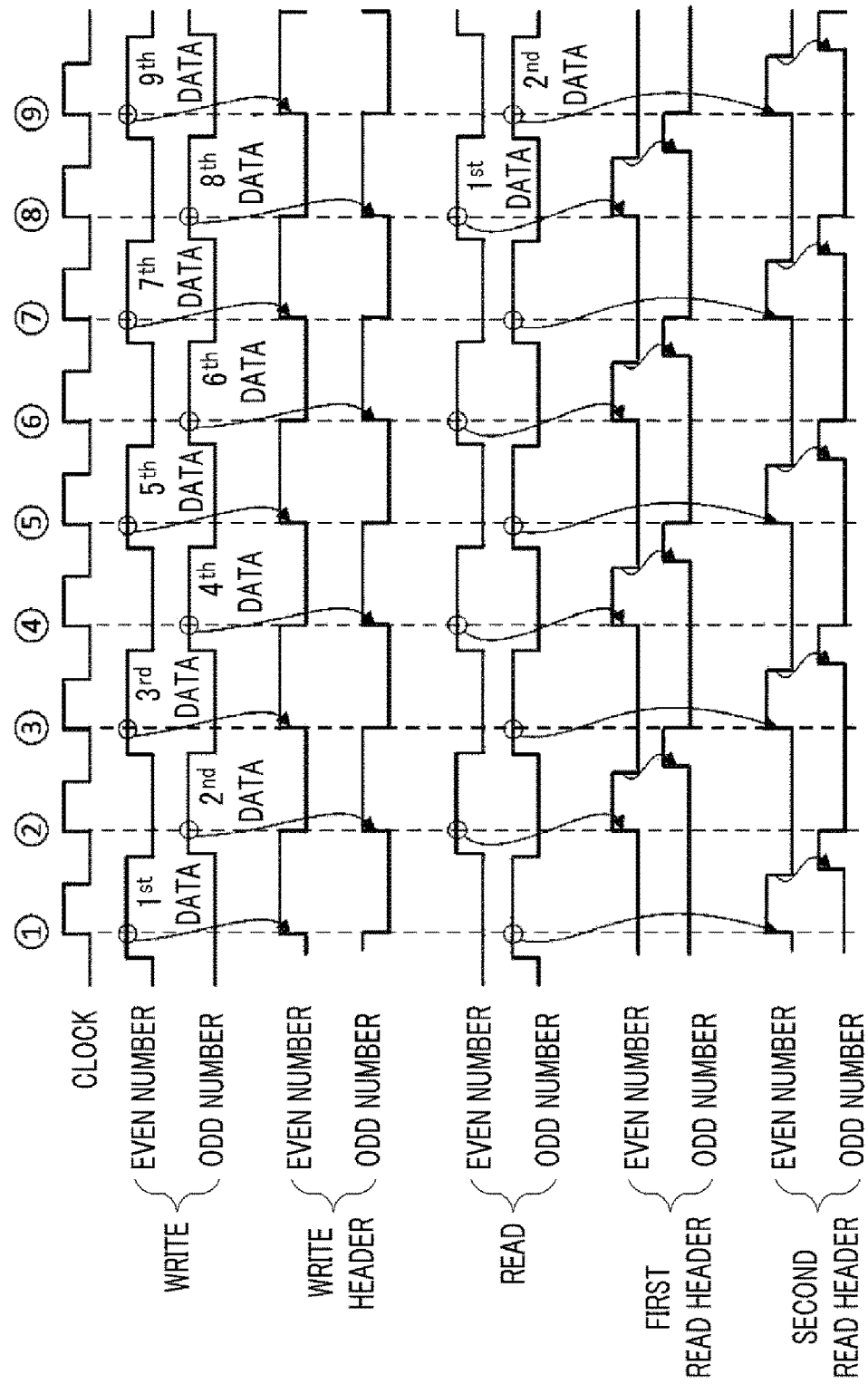

Herein, a data store operation performed by the write-only head of the input register and a read operation performed by the multiple read-only heads of the input register may be performed alternately. Referring to FIGS. 12A and 12B, data write and read processes of the input register will be described.

FIGS. 12A and 12B are exemplary diagrams of data write and read processes of the input register which are useful for understanding an exemplary embodiment of the present disclosure.

FIG. 12A illustrates an input register for the DA operation-based finite impulse response filter processing unit 630 in which the bit width or word length is 8 and the number of filter taps is 2. Herein, the input register may include two magnetic nanowires 1200 and 1210. Further, the input register may include write-only heads 1220 and 1230 respectively combined with the two magnetic nanowires 1200 and 1210, first read-only heads 1240 and 1250, and second read-only heads 1260 and 1270.

The any one of the magnetic nanowire in the input register may perform a write operation in an even clock. Further, the input register may write data in cells of the magnetic nanowires 1200 and 1210 respectively combined with write-only heads 1220 and 1230.

Further, after performing the write operation, the input register may perform a read operation through the first read-only heads 1240 and 1250 and the second read-only heads 1260 and 1270.

After performing the read operation through the first read-only heads 1240 and 1250 and the second read-only heads 1260 and 1270, the input register may perform a shift operation. Herein, the shift operation may be a right shift operation.

As such, in the input register, the write and read operations are performed alternately. Further, the input register may perform the shift operation together with the read operation in one clock cycle.

The input register may write data through the write-only head of the input register. Further, the input register may read data in sequence through the read-only heads of the input register in response to the FIFO method.

Hereinafter, write and read methods of the domain wall memory-based memory device 200 will be described with reference to FIG. 13.

Figure 13:
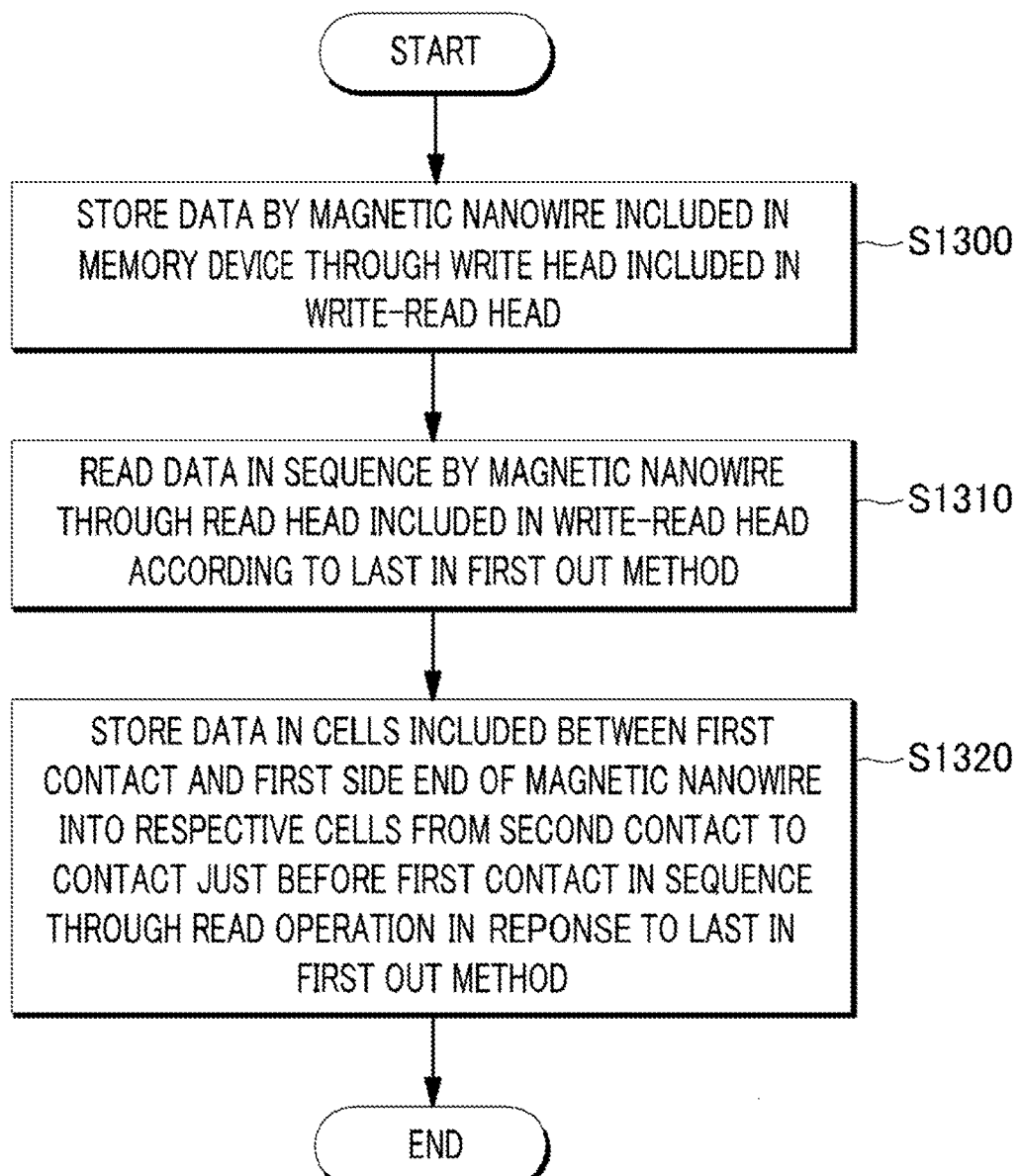
FIG. 13 is a flowchart of write and read methods of the memory device which is useful for understanding an exemplary embodiment of the present disclosure.

FIG. 13 is a flowchart of write and read methods of the memory device 200 which is useful for understanding an exemplary embodiment of the present disclosure.

A magnetic nanowire included in the memory device 200 stores data through a write head included in a write-read head (S1300). Herein, the memory device 200 includes at least one magnetic nanowire including multiple cells, a write-read head combined with a first contact of the magnetic nanowire, and a read-only head combined with a second contact of the magnetic nanowire.

The magnetic nanowire reads data in sequence through a read head included in the write-read head in response to the last in first out (LIFO) method (S1310).

The magnetic nanowire stores data in cells included between the first contact and a first side end of the magnetic nanowire into respective cells from the second contact to a contact just before the first contact in sequence through a read operation in response to the LIFO method (S1320).

Then, the magnetic nanowire may read the data stored in the cells from the second contact to the contact just before the first contact in sequence through the read-only head.

Herein, the memory device 200 may be the survivor memory 450 included in the Viterbi decoder 400. Therefore, in order to read data in sequence, the magnetic nanowire may output data for tracing back a survivor path through the read head included in the write-read head in response to a traceback read operation.

Since the domain wall memory-based memory device 200, the memory write and read methods using the memory device 200, and the digital signal processor 600 use a domain wall memory, the memory occupies a smaller area and consumes less power for writing and reading data than a conventional memory device using a static random access memory, and, thus, it is efficient in terms of energy and area. Further, since the domain wall memory-based memory device 200, the memory write and read methods using the memory device 200, and the digital signal processor 600 use multiple magnetic nanowires in turn, the performance similar to that of the conventional static random access memory-based memory device can be assured. Accordingly, the domain wall memory-based memory device 200, the memory write and read methods using the memory device 200, and the digital signal processor 600 are suitable for smart phones or IoT devices.

The exemplary embodiments can be embodied in a storage medium including instruction codes executable by a computer or processor such as a program module executed by the computer or processor. A data structure in accordance with the exemplary embodiments can be stored in the storage medium executable by the computer or processor. A computer-readable medium can be any usable medium which can be accessed by the computer and includes all volatile/non-volatile and removable/non-removable media. Further, the computer-readable medium may include all computer storage and communication media. The computer storage medium includes all volatile/non-volatile and removable/non-removable media embodied by a certain method or technology for storing information such as a computer-readable instruction code, a data structure, a program module or other data. The communication medium typically includes the computer-readable instruction code, the data structure, the program module, or other data of a modulated data signal such as a carrier wave, or other transmission mechanism, and includes information transmission mediums.

The system and method of the present disclosure has been explained in relation to a specific embodiment, but its components or a part or all of its operations can be embodied by using a computer system having general-purpose hardware architecture.

The above description of the present disclosure is provided for the purpose of illustration, and it would be understood by those skilled in the art that various changes and modifications may be made without changing technical conception and essential features of the present disclosure. Thus, it is clear that the above-described embodiments are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. A memory device based on a domain wall memory comprising:
   at least one magnetic nanowire including multiple cells;
   a write-read head combined with a first contact of the magnetic nanowire; and
   a read-only head combined with a second contact of the magnetic nanowire,
   wherein data stored through a write head included in the write-read head are read in sequence through a read head included in the write-read head in response to a last in first out (LIFO) method, and
   wherein data stored in cells included between the first contact and a first side end of the magnetic nanowire are stored in sequence into cells included between the second contact and a cell located just before the first contact through a read operation in response to the LIFO method.

2. The memory device based on a domain wall memory of claim 1,
   wherein the number of cells included between the first contact and a first side end of the magnetic nanowire is the same as the number of cells from the second contact to a contact just before the first contact.

3. The memory device based on a domain wall memory of claim 1, further comprising:
   one or more write bit lines combined with the write head included in the write-read head; and
   one or more read bit lines respectively combined with the read head included in the write-read head and the read-only head.

4. The memory device based on a domain wall memory of claim 1,
   wherein the memory device is a survivor memory included in a Viterbi decoder and outputs traceback data for tracing back a survivor path through the read head included in the write-read head in response to a traceback read operation.

5. A digital signal processor comprising a Viterbi decoder, wherein the Viterbi decoder includes a survivor memory, the survivor memory is a domain wall memory and includes:
   at least one magnetic nanowire including multiple cells;
   a write-read head combined with a first contact of the magnetic nanowire; and
   a read-only head combined with a second contact of the magnetic nanowire,
   data stored through a write head included in the write-read head are read in sequence through a read head included in the write-read head in response to a last in first out (LIFO) method, and
   data for tracing back a survivor path are output through the read head included in the write-read head in response to a traceback read operation of the Viterbi decoder;
   wherein data stored in cells included between the first contact and a first side end of the magnetic nanowire are stored in sequence into cells included between the second contact and a cell located just before the first contact through a read operation in response to the LIFO method.

6. A digital signal processor comprising a Viterbi decoder, wherein the Viterbi decoder includes a survivor memory, the survivor memory is a domain wall memory and includes:
   at least one magnetic nanowire including multiple cells;
   a write-read head combined with a first contact of the magnetic nanowire; and
   a read-only head combined with a second contact of the magnetic nanowire,
   data stored through a write head included in the write-read head are read in sequence through a read head included in the write-read head in response to a last in first out (LIFO) method, and
   data for tracing back a survivor path are output through the read head included in the write-read head in response to a traceback read operation of the Viterbi decoderwherein the Viterbi decoder includes a LIFO block,
   the LIFO block is a domain wall memory and includes:
   at least one magnetic nanowire including multiple cells;

a write-read head of the LIFO block combined with a first contact of the magnetic nanowire of the LIFO block, and data stored through a write head included in the write-read head of the LIFO block are read in sequence through a read head included in the write-read head of the LIFO block in response to the LIFO method.

7. A digital signal processor comprising a Viterbi decoder, wherein the Viterbi decoder includes a survivor memory, the survivor memory is a domain wall memory and includes:

at least one magnetic nanowire including multiple cells;
a write-read head combined with a first contact of the magnetic nanowire; and
a read-only head combined with a second contact of the magnetic nanowire,
data stored through a write head included in the write-read head are read in sequence through a read head included in the write-read head in response to a last in first out (LIFO) method, and
data for tracing back a survivor path are output through the read head included in the write-read head in response to a traceback read operation of the Viterbi decoder wherein the Viterbi decoder includes a LIFO block,
a pipelined fast Fourier transform (FFT) processing unit,
wherein the pipelined FFT processing unit includes a first in first out (FIFO) register file,
the FIFO register file is a domain wall memory and includes:
a magnetic nanowire including multiple cells;
a write-only head combined with a first contact of the magnetic nanowire of the FIFO register file; and
a read-only head combined with a second contact of the magnetic nanowire of the FIFO register file,
data stored through the write-only head of the FIFO register file are read in sequence through the read-only head of the FIFO register file in response to a FIFO method, and
the data store operation performed by the write-only head of the FIFO register file and the read operation performed by the read-only head of the FIFO register file are performed alternately.

8. The digital signal processor of claim 7, further comprising:
a pipelined sorting processing unit,
wherein the pipelined sorting processing unit includes the FIFO register file.

9. A digital signal processor comprising a Viterbi decoder, wherein the Viterbi decoder includes a survivor memory, the survivor memory is a domain wall memory and includes:
at least one magnetic nanowire including multiple cells;
a write-read head combined with a first contact of the magnetic nanowire; and
a read-only head combined with a second contact of the magnetic nanowire,
data stored through a write head included in the write-read head are read in sequence through a read head included in the write-read head in response to a last in first out (LIFO) method, and
data for tracing back a survivor path are output through the read head included in the write-read head in response to a traceback read operation of the Viterbi decoder wherein the Viterbi decoder includes a LIFO block,
a distributed arithmetic operation-based finite impulse response filter processing unit,
wherein the distributed arithmetic operation-based finite impulse response filter processing unit includes an input register,
the input register is a domain wall memory and includes:
a magnetic nanowire including multiple cells;
a write-only head combined with a first contact of the magnetic nanowire of the input register; and
multiple read-only heads combined with multiple contacts of the magnetic nanowire different from the first contact of the input register,
data stored through the write-only head of the input register are read in sequence through the read-only head of the input register in response to a FIFO method, and
the data store operation performed by the write-only head of the input register and the read operation performed by the multiple read-only heads of the input register are performed alternately.

10. A method for writing and reading a memory device including a domain wall memory, comprising:
storing data by a magnetic nanowire included in the memory device through a write head included in a write-read head;
reading the data in sequence by the magnetic nanowire through a read head included in the write-read head in response to a last in first out (LIFO) method; and
storing data stored in cells included between the first contact and a first side end of the magnetic nanowire into cells included between the second contact and a cell located just before the first contact in sequence through a read operation by the magnetic nanowire in response to the LIFO method after the reading the data in sequence,
wherein the memory device includes:
at least one magnetic nanowire including multiple cells;
the write-read head combined with a first contact of the magnetic nanowire; and
a read-only head combined with a second contact of the magnetic nanowire.

11. The method for writing and reading a memory device of claim 10, wherein the memory device is a survivor memory included in a Viterbi decoder, and the reading the data in sequence includes outputting data for tracing back a survivor path through the read head included in the write-read head in response to a traceback read operation.

* * * * *